US008314500B2

(12) United States Patent
Belanger et al.

(10) Patent No.: US 8,314,500 B2
(45) Date of Patent: Nov. 20, 2012

(54) INTERCONNECTIONS FOR FLIP-CHIP USING LEAD-FREE SOLDERS AND HAVING IMPROVED REACTION BARRIER LAYERS

(75) Inventors: Luc Belanger, Granby (CA); Stephen L. Buchwalter, Hopewell Junction, NY (US); Leena Paivikki Buchwalter, Hopewell Junction, NY (US); Ajay P. Giri, Poughkeepsie, NY (US); Jonathan H. Griffith, Lagrangeville, NY (US); Donald W. Henderson, Ithaca, NY (US); Sung Kwon Kang, Chappaqua, NY (US); Eric H. Laine, Binghamton, NY (US); Christian Lavoie, Pleasantville, NY (US); Paul A. Lauro, Brewster, NY (US); Valérie Anne Oberson, St-Alphonse de Granby (CA); Da-Yuan Shih, Poughkeepsie, NY (US); Kamalesh K Srivastava, Wappingers Falls, NY (US); Michael J. Sullivan, Red Hook, NY (US)

(73) Assignee: Ultratech, Inc., San Jose, CA (US)

( * ) Notice: Subject to any disclaimer, the term of this patent is extended or adjusted under 35 U.S.C. 154(b) by 543 days.

(21) Appl. No.: 11/616,919

(22) Filed: Dec. 28, 2006

(65) Prior Publication Data

US 2008/0157395 A1 Jul. 3, 2008

(51) Int. Cl.
*H01L 23/48* (2006.01)
*H01L 23/52* (2006.01)
*H01L 29/40* (2006.01)

(52) U.S. Cl. ........ 257/779; 257/753; 257/761; 257/766; 257/780; 257/E23.02; 257/E23.021; 257/E23.023

(58) Field of Classification Search .................. 257/751, 257/753, 779, 781
See application file for complete search history.

(56) References Cited

U.S. PATENT DOCUMENTS

| 6,111,321 | A  | * | 8/2000  | Agarwala    | 257/772 |
|-----------|----|---|---------|-------------|---------|
| 6,617,237 | B1 | * | 9/2003  | Tong et al. | 438/613 |
| 6,969,915 | B2 | * | 11/2005 | Tago et al. | 257/781 |
| 2002/0151164 | A1 | * | 10/2002 | Jiang et al. | 438/613 |
| 2003/0157792 | A1 | * | 8/2003  | Tong et al.  | 438/614 |
| 2003/0162380 | A1 | * | 8/2003  | Tong et al.  | 438/613 |
| 2003/0189261 | A1 | * | 10/2003 | Tong et al.  | 257/780 |
| 2003/0234453 | A1 | * | 12/2003 | Liu et al.   | 257/778 |
| 2004/0113272 | A1 | * | 6/2004  | Chen et al.  | 257/737 |
| 2004/0127009 | A1 | * | 7/2004  | Chen et al.  | 438/612 |

(Continued)

FOREIGN PATENT DOCUMENTS

JP 2000195885 A * 7/2000

*Primary Examiner* — Evan Pert
*Assistant Examiner* — Leslie Pilar Cruz
(74) *Attorney, Agent, or Firm* — Allston L. Jones; Peters Verny, LLP (57) ABSTRACT

An interconnection structure suitable for flip-chip attachment of microelectronic device chips to packages, comprising a two, three or four layer ball-limiting metallurgy including an adhesion/reaction barrier layer, and having a solder wettable layer reactive with components of a tin-containing lead free solder, so that the solderable layer can be totally consumed during soldering, but a barrier layer remains after being placed in contact with the lead free solder during soldering. One or more lead-free solder balls is selectively situated on the solder wetting layer, the lead-free solder balls comprising tin as a predominant component and one or more alloying components.

1 Claim, 6 Drawing Sheets

U.S. PATENT DOCUMENTS

2004/0185651 A1* 9/2004 Wu et al. .................. 438/618
2005/0212133 A1* 9/2005 Barnak et al. ............. 257/738
2005/0224966 A1* 10/2005 Fogel et al. ............... 257/737
2006/0043156 A1* 3/2006 Debelius et al. ....... 228/180.22
2006/0049521 A1* 3/2006 Kayukawa et al. ......... 257/737
2006/0094223 A1* 5/2006 Tsai ......................... 438/612
2006/0202352 A1* 9/2006 Li et al. .................... 257/779

* cited by examiner

INTERCONNECTIONS FOR FLIP-CHIP USING LEAD-FREE SOLDERS AND HAVING IMPROVED REACTION BARRIER LAYERS

FIELD OF THE INVENTION

This invention relates to the interconnection of microelectronic integrated circuit (IC) devices to packages, and in particular area-array flip-chip interconnect technology often called C4 (controlled collapse chip connection). The invention further pertains to interconnection schemes that are environmentally acceptable due to the use of lead-free solder alloys and environmentally benign fabrication processes. Further, the invention pertains to interconnection schemes that eliminate sources of soft errors in on-chip circuitry through the elimination of alpha-particle sources in the solder in contact with the microelectronics circuit.

BACKGROUND OF THE INVENTION

In the packaging of semiconductor chips, a hierarchy of interconnections is necessary. At the level of the interconnection between the chip and the substrate (or chip carrier), three different interconnection technologies are widely employed: tape automated bonding (TAB), wire bonding, and area array flip chip interconnect.

The solder bump area array interconnect scheme is often called flip-chip solder connection or C4, the face-down soldering of integrated circuit devices (IC) to chip carriers. Unlike wirebonding, the area array solder bump configuration allows the entire surface of the chip to be covered with C4 bumps for the highest possible input/output (I/O) counts to meet the ever increasing demand on the electrical functionality and reliability of the IC technology, than can wire bonding or TAB, which confine the interconnections to the chip periphery.

More specifically, the C4 technology uses solder bumps deposited on a patterned solder-wettable layered structure known as the ball-limiting metallurgy (BLM), which is also called under-bump metallurgy (UBM). Ball-limiting metallurgy (hereinafter the "BLM") defines the terminal metal pads on the top surface of the front- and back-end-of-line (FEOL and BEOL) wiring layers fabricated on the chip that is wettable by the solder, and which also limits the lateral flow of molten solder away from the terminal pad area. After the solder bumps are fabricated on the patterned UBM pads on the chip to form balls, the chips are joined to a matching footprint of solder-wettable pads on the chip carrier. It is the face-down placement of the chip on the carrier that has led C4 technology to be called flip-chip joining. Compared to other methods of interconnection, the C4 technology offers distinct advantages, including the following: 1) shorter interconnect distances, allowing faster signal response and reduced inductance coupling and cross-talk; 2) more uniform power and heat distribution; 3) reduced simultaneous switching noise; and 4) greater design flexibility with the highest possible total input/output counts.

Fabrication of Pb—Sn C4 interconnections by evaporation through a metal mask has been developed and perfected since the mid-1960s by IBM. Both the C4 bumps and BLM pads are evaporated through the patterned metal masks to form a highly reliable, high-density interconnect structure; it has proven extendability from the earliest low density, low Input/output counts smaller IC devices through the high density, high input/output count IC products of the 2000s. However, it is believed that the limit of extendibility to larger wafer sizes, more dense arrays and Pb-free applications has nearly been reached by the evaporation method.

Alternative methods to evaporation are electro-plating, paste screening, solder jetting and, more recently, the C4NP, which stands for C4 "New Process", to name a few. Electrochemical plating fabrication of C4s, which is a selective and efficient process, has been reported in the literature by, for example, Yung in U.S. Pat. No. 5,162,257, which is incorporated herein by reference. Manufacturability and other integration issues of electrochemically fabricated C4s have been described by Datta, et al. in the J. Electrochem. Soc., 142, 3779 (1995), which is also incorporated herein by reference. Using plating and etching processes, and through the development of sophisticated tools, it is possible to obtain a high degree of compositional and volume uniformity of electroplated solders, uniform dimensions of the ball-limiting metallurgy (BLM), and a controlled BLM edge profile.

The electrochemical process is more extendible to larger wafers and to finer C4 dimensions than the evaporated C4 technology. Electrodeposition through a photoresist mask produces solder only in the mask opening and on top of the UBM. Electrodeposition, in contrast to evaporation, is extendible to high-tin content lead-free alloys and large 300 mm wafers.

The C4NP fabricated C4 solder bumps have been described in the literature by Gruber, et al. in U.S. Pat. No. 6,231,333, which is incorporated herein by reference. Manufacturing and other integration issues of C4NP fabricated C4s have also been described by Gruber, et al. in the IBM J. RES & DEV. 49, 4/5 (2005), which is incorporated herein by reference. The technology makes efficient use of bulk solders that easily incorporate multi-component ternary and quaternary leaded and no-lead solder alloys, with precisely controlled solder composition and low alpha particle control to perform environmental-friendly wafer bumping to achieve both high density and low cost applications. It can achieve high degrees of dimensional and volume uniformity, and is extendible to large 300 mm wafers.

A generic C4 structure consists of all of the elements beginning with the ball-limiting metallurgy (hereinafter the "BLM"). The multi-layer BLM structure generally consists of an adhesion layer, a reaction barrier layer, and a wettable layer to facilitate solder bump joining between the IC device and the interconnection structure, the chip carriers. The different metal layers in the BLM structure are chosen to be compatible with each other and with the solder alloys, to meet not only stringent electrical, mechanical and reliability requirements in the C4 joint, but also to allow easy fabrication.

A detailed description of the elements comprising a three-layer BLM structure and C4 bumps are summarized as follows.

1) The first layer to be deposited on the top surface of wafer is the adhesion layer of the BLM which provides adhesion to the underlying substrate. This layer can also serve as a diffusion/reaction barrier layer to prevent any interaction between the back-end-of-line (BEOL) wiring layers with solder. This is a thin layer typically deposited by sputtering, evaporation or induction heating on the surface of the wafer passivation layer, which is commonly made of polymer, oxide or nitride materials, or the combination of them. Candidates for adhesion layer are Cr, Ti, W, TiW, Ta, TiN, TaN, Zr etc. to name a few, on the order of hundreds to thousands angstroms in thickness.

2) The next layer of the BLM is a reaction barrier layer which is solderable by the molten solder but react slowly (limited controlled reaction) to allow for multiple thermal reflow cycles (or rework cycles) without being totally consumed. Candidates for a reaction barrier layer are Ni, Co, W, Ru, Hf, Nb, Mo, V, Ta and their alloys. to name a few. This layer is typically on the order of thousands of angstroms to microns in thickness, deposited by sputtering, evaporation, electroless- or electrolytic plating.

3) The final layer of the BLM is the wettable layer, allowing easy solder wettability and fast reaction with solder. Typical examples are copper, palladium, gold, tin and their alloys, typically in the range of a few hundreds to thousands of angstroms in thickness, deposited by sputtering, evaporation, electroless- or electrolytic plating. In some special chip joining applications, Cu thickness can be increased to the range of microns in thickness.

4) For the C4 bumps formed on top of the BLM structure, a number of manufacturing processes have been developed that include evaporation, plating, stencil printing, paste screening and solder jetting, and molten solder injection, to name a few.

5) After formation of the bumps, solder bumps are reflowed. Reflow is done typically in an inert or reducing atmosphere ($N_2$ or $H_2/N_2$ mixture gas) in a belt furnace or in a vacuum furnace or in an oven. During reflow, intermetallic compounds form between solder and the reaction barrier layer. These compounds serve to provide good mechanical integrity for a reliable solder joint.

6) Finally, the wafer is tested and diced into chips, through a dice, sort and pick (DSP) operation. Good chips (those passed electrical test specifications) are picked and are aligned and flip joined to a chip carrier through the use of a suitable flux or fluxless joining.

SUMMARY OF THE INVENTION

It is therefore an aspect of the present invention to provide a BLM structure for flip chip attachment that is suitable for use with and uses both lead free and leaded solders.

It is another object of the invention to provide flip chip electrical connections that reduce the occurrence of soft errors in computer chips.

The present invention focuses on cost-effective, environmentally sound, reliable BLM for lead-free solders in C4 joints. The present invention also provides the enabling processes for fabrication of an integrated C4 structure, i.e., the selection of the BLM and the deposition and patterning processes used to produce the final BLM structure.

A lead-free C4 typically has Sn as the predominate component, typically greater than 90 weight %, and one or more alloying elements. Because of the nature of Sn, which is highly reactive, lead-free solders require a more robust reaction barrier layer to protect the terminal metal in the ball-limiting metallurgy and the underlying wiring layers from attack by the Sn-rich solder. The most likely candidates for lead-free solders are tin based alloys which is doped with a small amount of silver, copper, cobalt, nickel, bismuth, antimony, to name a few.

The elimination of lead from electronic solders is desirable because of the toxicity of lead. Lead leaching out from the electronic assembly in landfill into ground water under acid rain condition has been widely reported. The use of lead-free solders also facilitates a means of limiting the soft error rates in IC device that are caused by alpha particle emission from leaded solder.

The solders may be produced by electroplating, evaporation, paste screening or an injection molded solder process which was disclosed in U.S. Pat. Nos. 5,244,143; 5,775,569; 6,003,757; and 6,056,191.

Thus the invention is directed to an interconnection structure suitable for flip-chip attachment of microelectronic device chips to chip carriers, a three-layer ball limiting metallurgy comprising an adhesion layer for deposition on a wafer or substrate; a solder reaction barrier layer preferably of a material selected from the group consisting of Ni, Co, W, Ru, Hf, V, Mo, Nb and their alloys; and a solder wettable layer. The adhesion layer preferably may be formed of a material selected from the group consisting of Cr, Ti, TiW, TiN, TaN, Ta, Zr, and ZrN. The solder wettable layer, the top layer, may preferably be formed of a material selected from the group consisting of Cu, Pd, Au, Pt, and Sn. The interconnection structure may further comprise an optional fourth layer preferably formed of a material selected from the group consisting of Au and Sn, if Au or Sn is not already been used in the prior layer. In one embodiment, the adhesion layer is preferably comprised of one of Cr, Ti and TiW; the reaction barrier is comprised of Ni Co, Ru, Hf, Nb, V, W and their alloys, and the solder wettable layer is preferably comprised of one of Cu, Au, Sn, Pd and Pt.

The invention is also directed to an interconnection structure suitable for flip-chip attachment of microelectronic device chips to packages, comprising a two-layer BLM structure comprising an adhesion and a reaction barrier layer, wherein the two layer structure condenses the adhesion, reaction and wettable properties of a multilayer thin film structure into two layers, thus simplifying process steps and reducing production cost. In one example, the adhesion/barrier layer is combined with a solder wettable layer which is a metal layer readily reactive with a tin-containing lead-free solder, so that the solder wettable layer is consumed during soldering, wherein the adhesion/reaction barrier layer remains after being placed in contact with the lead free solder during soldering; and one or more lead-free solder balls are selectively situated on the solder wettable layer, the lead-free solder balls comprising tin as a predominant component doped with one or more alloying components. The adhesion/reaction barrier layer may preferably be comprised of a material selected from the group consisting of one of TiW, TiN, and Ti. The solder wettable layer may preferably be comprised of a material selected from the group consisting of Cu, Au, Pd, Ni, Co, Ru, and Sn, and their alloys. The interconnect structure may further comprise an optional third layer preferably comprised of Au or Sn, if they have not already been used in the second layer. Preferably, the lead-free solder ball is comprised of a material that substantially avoids alpha particle emission. The solder alloys having tin as a predominant component and one or more alloying components preferably selected from the group consisting of Cu, Ag, Bi, Ni, Co, Fe, and Sb.

The invention is also directed to an interconnection structure suitable for flip-chip attachment of microelectronic IC device chips to packages, comprising a three-layer BLM, an adhesion layer, a reaction barrier layer on top of the adhesion layer and a solder wettable layer, wherein the adhesion/barrier layer is between a microelectronic device and the solder wettable layer and wherein the solder wettable layer is of a composition sufficiently reactive with components of a tin-containing lead free solder, and the reaction barrier layer is substantially less-reactive with solder after being placed in contact therewith in a solder joining process; and one or more lead-free solder balls selectively situated on the solder wettable layer, whereby the lead-free solder ball substantially avoids alpha particle emission and induced soft logic errors which result therefrom.

The invention is further directed to a method for forming an interconnection structure suitable for flip-chip attachment of microelectronic device chips to packages, comprising forming a blanket ball limiting metallurgy on a wafer or substrate; forming a resist pattern on the blanket BLM layer; etching the BLM by using the resist as an etch mask; stripping the resist to form the solder wettable BLM terminal pads; and depositing solder on the BLM pads. The solder may be substantially lead free. The BLM pads may be formed by depositing an adhesion layer on the substrate; depositing a reaction barrier layer on the adhesion layer; and depositing a solder wettable layer on the barrier layer. The reaction barrier layer may be comprised of a material preferably selected from the group consisting of Ni, Co, Ru, W, Hf, Nb, V, Mo, and their alloys. The adhesion layer may be deposited by sputtering, evaporation or induction heating, and may have a thickness of between 100 to about 5000 Angstroms. The reaction barrier layer may be deposited by sputtering, plating or evaporation, and may have a thickness of about 1,000 to about 30,000 angstroms. The solder wettable layer also may be deposited by sputtering, plating or evaporation, and have a thickness of about 100 to about 20,000 angstroms.

The method may further comprise depositing an optional layer preferably comprising Au, Pd or Sn on the solder wettable layer. The layer deposited on the solder wettable layer may have a thickness of between substantially 100 to substantially 10,000 angstroms, and may preferably be deposited by one of sputtering, electro- or electroless plating or evaporation.

The method preferably further comprises preferably annealing the ball limiting metallurgy at 150-350 degrees C. for 30 to 90 minutes.

The invention is also directed to a method for forming an interconnection structure suitable for flip-chip attachment of microelectronic device chips to chip carriers, comprising depositing an adhesion layer on a wafer or substrate serving as the chip carrier; depositing a solder reaction barrier layer on the adhesion layer; depositing a solder wettable layer on the reaction barrier layer; depositing a lead free solder on the solder wettable layer; and reflowing the solder so that the solder wettable layer diffuses into the lead free solder. The solder wettable layer may preferably contain Cu. When Cu dissolves into pure Sn solder during the reflow process, a binary Sn—Cu lead-free solder is formed. The lead free solder candidate may substantially binary Sn—Ag, and a ternary Sn—Ag—Cu lead-free solder is thus formed during reflowing on a Cu containing wettable layer.

The number of elements in the solder is increased by at least one element, by the dissolution of the Cu. A eutectic binary or near ternary eutectic solder may be formed. The method may further comprising annealing at 150-350 degrees C. for 30 to 90 minutes.

BRIEF DESCRIPTION OF THE DRAWINGS

These and other aspects, features, and advantages of the present invention will become apparent upon further consideration of the following detailed description of the invention when read in conjunction with the drawing figures, in which:

FIGS. 5A and 5B are SEM cross-sectional views of a binary eutectic Sn0.7 wt. % Cu Pb-free solder after reaction with a three-layer TiW/NiSi/Cu BLM at 250 degree C. continuously for 40 minutes. FIG. 5A is for lower magnification, and FIG. 5B for higher magnification.

FIGS. 6A and 6B are SEM cross-sectional views of Sn0.7% Cu Pb-free solder after reaction with a three-layer TiW/NiW/Cu BLM at 250 degree C. continuously for 40 minutes. FIG. 5A is lower magnification, and FIG. 5B is higher magnification.

DESCRIPTION OF THE INVENTION

Variations described for the present invention can be realized in any combination desirable for each particular application. Thus particular limitations, and/or embodiment enhancements described herein, which may have particular advantages to the particular application need not be used for all applications. Also, it should be realized that not all limitations need to be implemented in methods, systems and/or apparatus including one or more concepts of the present invention.

Figure 1:
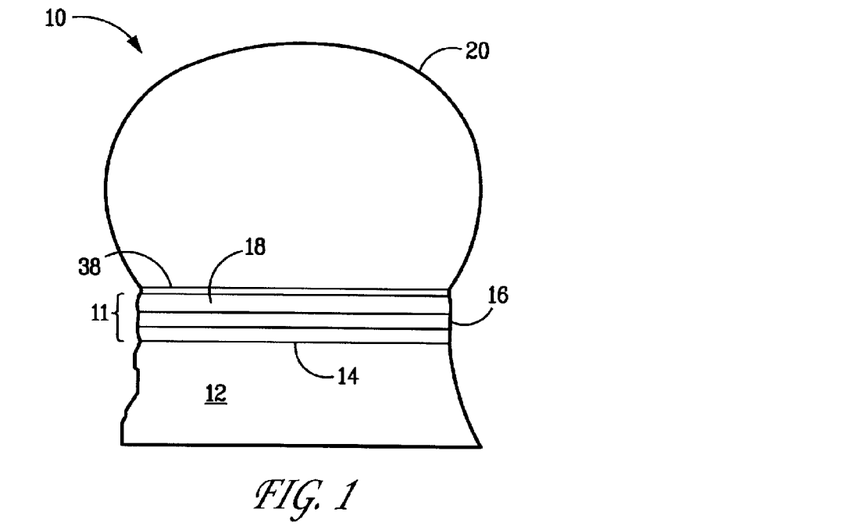
FIG. 1 is a cross-sectional view of a first embodiment of C4 structure in accordance with the invention.

Referring to FIG. 1, an interconnection structure 10 suitable for the connection of microelectronic integrated circuit (IC) chips to packages is provided by this invention. In particular, the invention pertains to the area-array or flip-chip technology often called C4 (controlled collapse chip connection). The BLM (also named an under bump metallurgy (UBM))) 11 is deposited on passivated integrated circuit (IC) device 12 (e.g., a silicon wafer). A first layer of the BLM 11 is an adhesion/diffusion barrier layer 14 which may preferably be a metal, alloy or compound selected from the group consisting of Cr, Ti, TiW, V, Zr, Ta and their alloys (or compounds), and may have a thickness of about 100 to 5,000 Angstroms, and may be deposited by evaporation, sputtering, or other known techniques. A solder reaction barrier layer 16 of a metal or compound preferably selected from the group consisting of Ni, Co, Ru, Hf, Nb, Mo, W, V and their alloys (or compounds) may be subsequently deposited on the adhesion layer, preferably by, for example, sputtering, plating, or evaporation to a thickness of about 500 to 30,000 Angstroms. Top layer 18 is a solderable layer consisting preferably of a metal selected from the group of Cu, Au, Pd, Pt, Sn and their alloys, by, for example, sputtering, plating, or evaporation to a thickness of about 500 to 20,000 Angstroms. In some special applications, the three-layer BLM structure can be simplified to two layers if when the same element is selected for both the second and third layer; the same applies to the first and second layer. An optional fourth layer, 38, such a thin layer preferably of gold or Sn, may be deposited on layer 18 to act as a protection layer against oxidation or corrosion. Solder 40 is then applied, as shown in FIG. 1.

The C4 structure 10 may be completed with a lead-free solder ball 20 comprising tin as the predominate component and preferably one or more alloying elements selected from Ag, Cu, Bi, Ni, Co, In and Sb.

EXAMPLE 1

A Three Layer BLM

In accordance with the present invention, a preferred adhesion layer 14 is TiW or Ti, which is preferably either sputtered or evaporated, at a preferred thickness of about 100 to 5000 angstroms. The thickness of the adhesion layer 14 can vary widely as long as both good adhesion and good barrier properties are maintained. If blanket TiW is deposited and subsequently etched as the final step in forming the patterned BLM structure, 11, the film thickness should be minimized consistent with adequate performance. An alternative adhesion layer is Cr, Ta, W or their alloys at a thickness of about 100 to 5000 angstroms.

The second layer 16 is a solder reaction barrier layer, preferably typically a few thousand angstroms to several microns in thickness, deposited preferably by sputtering, evaporation or plating. Since the high tin content Pb-free solders are highly reactive than the eutectic Pb-rich Pb—Sn solder, a thick reaction barrier layer is needed to survive multiple thermal cycles without being totally consumed. A total consumption of BLM will lead to a "floating BLM" failure that degrades the mechanical integrity of the solder joint. Since Cu is highly reactive with high Sn solder, a less reactive metal, such as Ni or its alloys, in the BLM is preferred for lead-free application.

In accordance with the invention, it has been found that suitable solder reaction barrier layers may preferably be formed of Ni, Ru, Co, W, Hf, Nb, Mo, V, and their alloys.

The third layer 18 is a solder wettable layer. Layer 18 is easily wettable by, and potentially totally dissolved into, the molten solder during reflow joining, thus allowing for the formation of a reliable metallurgical joint to the BLM pad through the formation of intermetallic compounds with the reaction barrier layer. The wettable layer is a metal preferably selected from the group consisting of Cu, Au, Pd, Pt, Sn, and their alloys. Both copper and gold react very rapidly with high-tin solders and do not provide a suitable reaction barrier layer. However, these metals all react and wet well with solder and therefore serve as the top layer for oxidation protection, wetting and joining to the C4 solder.

In an added benefit, Cu dissolving into solder can be used as an alloying element for the solder. For example, when Cu is dissolved into pure Sn solder, it forms the binary Sn—Cu solder alloy. When dissolved into binary SnAg alloy, it forms the ternary near eutectic Sn—Ag—Cu solder. Both Sn—Cu and Sn—Ag—Cu are the leading Pb-free solder candidates for microelectronic assembly. The dissolution and incorporation of Cu as an added alloying element in solder is shown to simplify the plating processes. Instead of plating a ternary alloy of Sn—Ag—Cu, which is very complicated, a simpler plating of binary SnAg alloy can be easily performed, with the alloying element Cu coming from the BLM pad. The same approach applies to the plating of pure Sn which is very simple, and the subsequent reaction of pure Sn with Cu, which is from the BLM pad, to form a simple binary alloy system which is simpler than plating the binary Sn—Cu alloy to facilitate manufacturability. Maintaining the bath chemistry and precise control of solder composition during plating of multicomponent solder alloys is very complicated, and this complexity can be simplified using this approach. It is noted that Cu rapidly dissolves into the essentially liquid solder during the reflow portion of the process, thus assuring that the composition of the solder ball is relatively uniform.

Figure 1A:
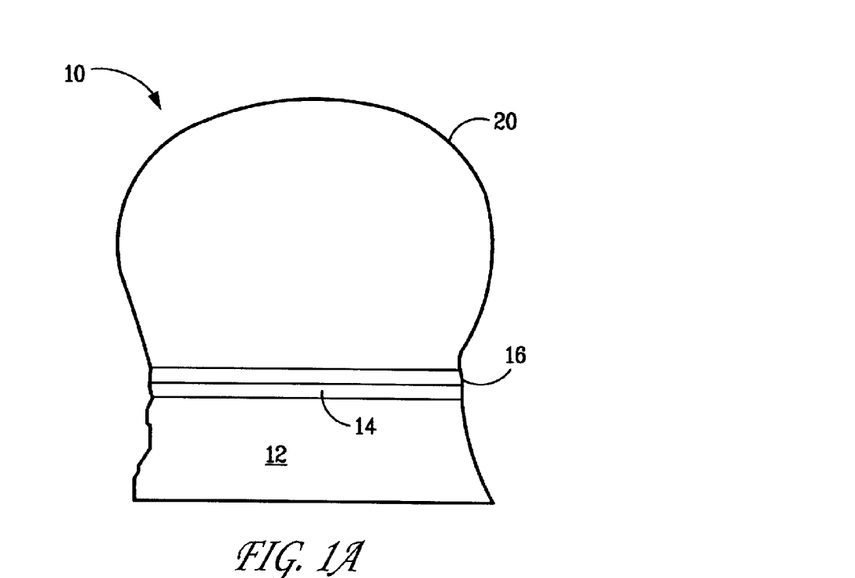
FIG. 1A is a cross-sectional view of the embodiment of FIG. 1 after solder reflow.
Figure 4:
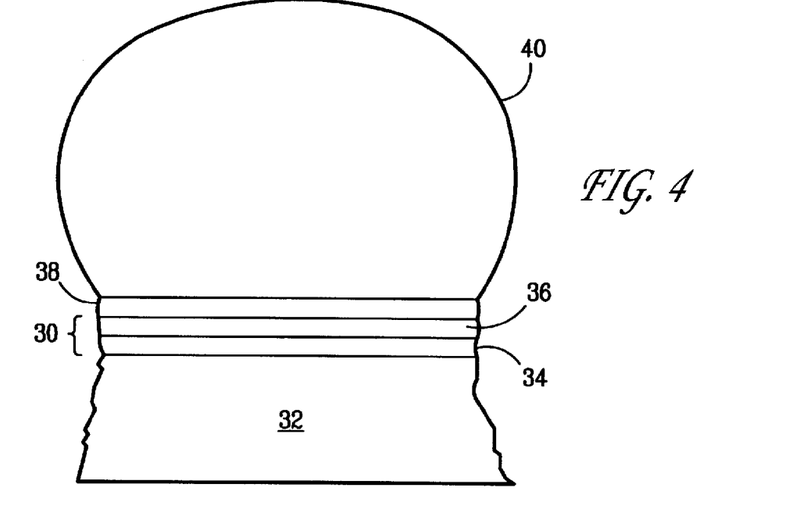
FIG. 4 is a cross-sectional view of a second embodiment of C4 structure in accordance with the invention.
Figure 4A:
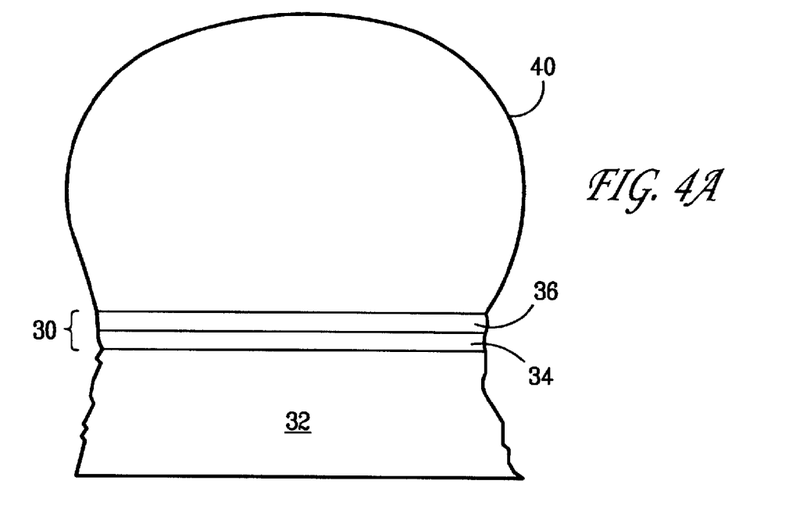
FIG. 4A is a cross-sectional view of the embodiment of FIG. 4 after solder reflow.

The manner in which the solder wettable layer is dissolves into the solder ball is shown in FIG. 1A for the first exemplary embodiment of the invention, and in FIG. 4A for a second embodiment of the invention.

The solderable layer may be sputtered, evaporated or plated using the same procedure as that used for the deposition of the other BLM layers. Subsequently, the blanket films must be patterned to form the BLM 11 in the finished structure depicted in FIG. 1.

EXAMPLE 2

A Four Layer BLM

In this example, the first layer is preferably TiW, Cr or Ti. The second layer is preferably Ni, Co, Ru, W or their alloys (or compounds). The third layer is preferably Cu, Pd, Pt or their alloys. A fourth layer preferably may be Au or Sn.

EXAMPLE 3

A Simple Two Layer BLM

In this example, the first layer is preferably TiW, Ti or Cr which serves as an adhesion/reaction barrier layer. The second layer is preferably selected from the group consisting of Ru, Ni, Cu, Co, Sn, or their alloys.

In all three or four layer structures Cu is the preferred wettable layer, fast reaction and dissolution of Cu into molten solder alloy during reflow joining forms the Cu—Sn intermetallic compounds which adheres well at BLM/solder interface to enhance the mechanical integrity of the solder joint.

The melting properties of the solder alloy that is used over the UBM must be compatible with manufacturing requirements. The preferred deposition method for the solder is C4NP, electrodeposition (either direct electrodeposition of the alloy or sequential deposition of the individual alloy components), stencil printing or by paste screening.

Figure 2A:
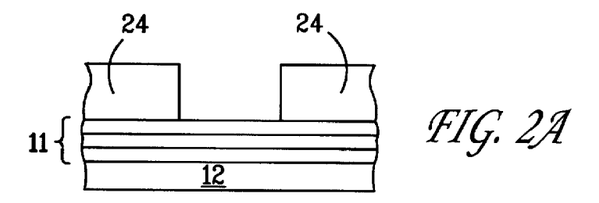
FIGS. 2A to 2D show steps in accordance with a first method for forming the C4 structures in accordance with the invention.

FIG. 2A to FIG. 2D illustrate steps in producing the structure of FIG. 1. In FIG. 2A the BLM 11 of FIG. 1, including layers 14, 16 and 18 is produced on a wafer or substrate 12, as explained above. The C4 pattern is defined on the wafer with an appropriate photoresist pattern 24, of thickness at least as great as the thickness of the solder which is to be deposited.

Figure 2B:
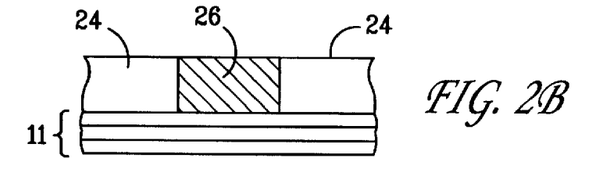
Figure 2C:
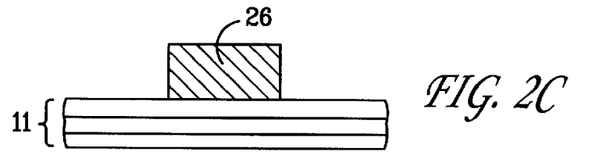
Figure 2D:
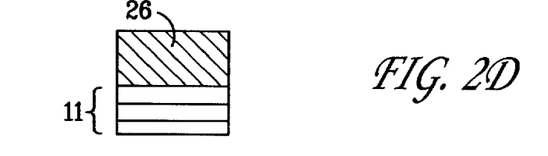

Referring to FIG. 2B, the lead-free solder 26 is transfer deposited onto BLM by means of molten solder injection, plating, paste screening, stencil printing or solder jetting, to name a few. Sequential electroplating of the solder components, followed by mixing upon reflow, is an alternative to direct plating of the alloy. The blanket BLM layer in FIG. 2C not covered under the solder is subsequently etched as shown in FIG. 2D.

The solder is reflowed in an appropriate atmosphere to form a solder ball, as illustrated in FIG. 1.

The wafer 12 may then be diced, sorted, picked and good chips are joined to a ceramic or organic chip carrier employing a suitable flux or by fluxless joining.

Figure 3A:
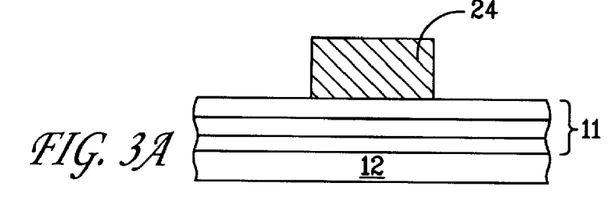
FIGS. 3A to 3D show steps in accordance with a second method for forming the C4 structures in accordance with the invention.
Figure 3B:
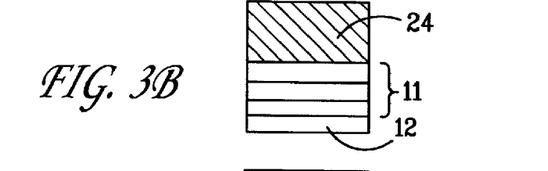
Figure 3C:
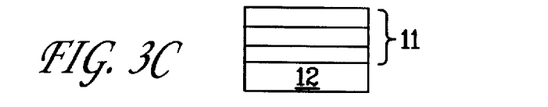
Figure 3D:
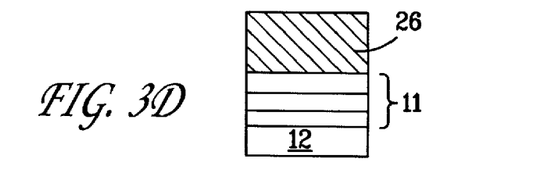

FIG. 3A to FIG. 3D illustrate an alternative process to form the structure of FIG. 1. In FIG. 3A, a photoresist pattern 24, is deposited over the blanket BLM 11. FIG. 3B illustrates the etching of the layers of the BLM 11 which is not covered under the photoresist 24. The photoresist pattern 24 being used as an etch mask to pattern the BLM. In FIG. 3C, the photoresist pattern 24 is stripped off the patterned BLM layers. In FIG. 3D, the solder bumps are selectively deposited on the patterned BLM 11 on either wafer or substrate by means of C4NP molten solder transfer, paste screening, stencil printing, etc.

The solder bump 26 is then reflowed in an appropriate atmosphere.

The wafer is then diced, sorted and picked. Good chips are selected and joined to a chip carrier either with a suitable flux or fluxlessly joined.

FIG. 4 is a cross-sectional view of a, exemplary second embodiment of C4 structure in accordance with the invention. The BLM 30 is a two layer structure suitable for deposition on a substrate or wafer with oxide, nitride or polyimide passivation 32. The first layer 34, which is deposited on the surface of the passivated wafer or substrate may preferably be Cr, Ti, TiW, Zr, V or their alloys. The next layer 36 serves both as a reaction barrier and solderable layer, is deposited on the layer 34, and may preferably be selected from the group of Ru, Ni, Co, Cu, Pd, Pt, or their alloys. An optional third layer 38, such as preferably a thin layer of gold or Sn, may be deposited on layer 36 to act as an oxidation protection layer. Optional layer 38 should be a material other than that already selected for the second layer. Again, with the described layered structure if the selected element is already used in the prior layer it will not be used for the subsequent layer to avoid duplication. Solder 40 is then applied, as in FIG. 1.

As noted above, when the optional layer 38 is not applied and the top layer of FIG. 4 is, for example Cu, the manner in which the solder wettable layer is dissolved into the solder ball 40 is shown FIG. 4A.

The embodiment illustrated in FIG. 4 may be formed using either one of the methods illustrated in FIG. 2A to FIG. 2D or in FIG. 3A to FIG. 3D.

Figure 5A:
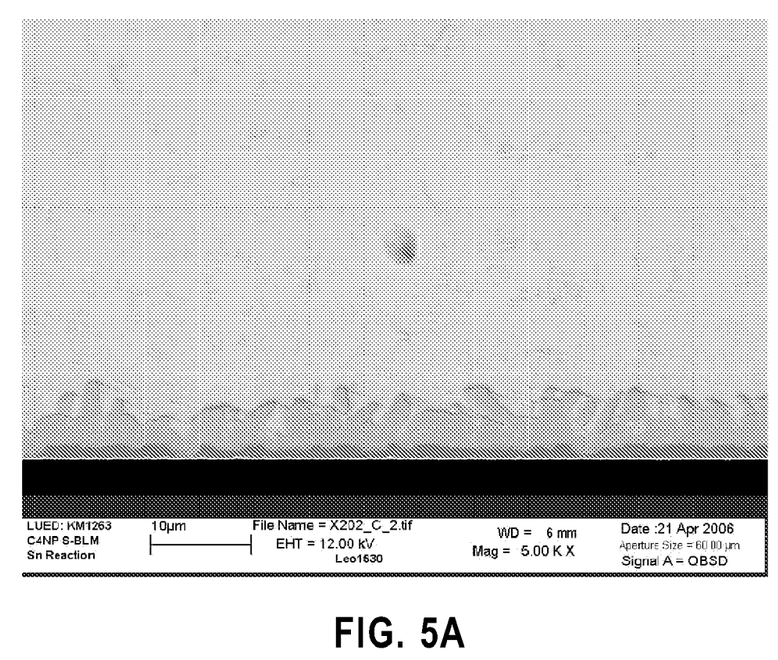
Figure 5B:
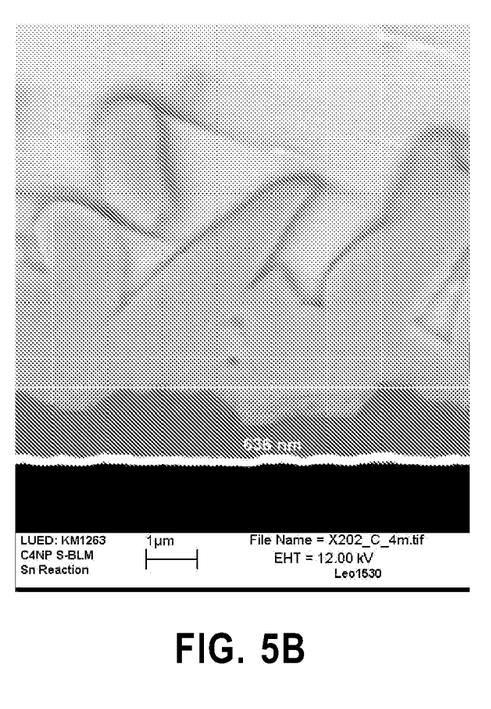

FIG. 5 is a SEM cross-sectional view of a binary Sn0.7% Cu Pb-free solder alloy after reaction with a three-layer TiW/NiSi/Cu BLM at 250 degree C. continuously for 40 minutes. FIG. 5A is lower magnification, and FIG. 5B is higher magnification. TiW is an adhesion layer; NiSi is a reaction barrier layer; and Cu is a solderable layer which, after reflow joining, is totally dissolved into solder.

Figure 6A:
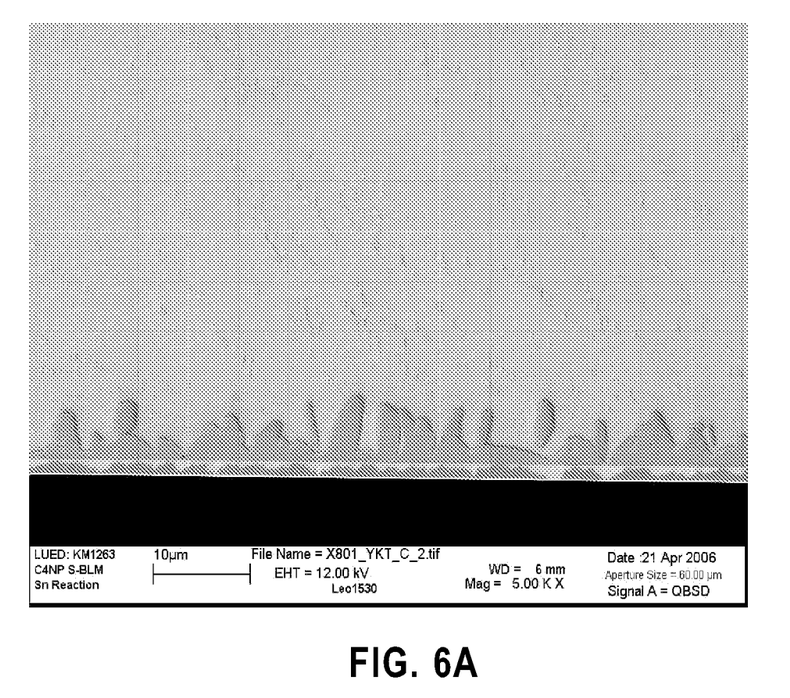
Figure 6B:
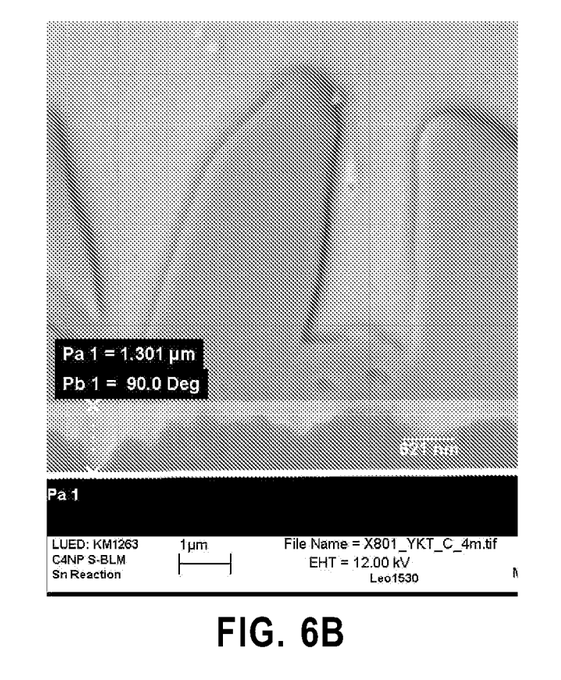

FIG. 6 is a SEM cross-sectional view of binary Sn0.7% Cu Pb-free solder alloy after reaction with a three-layer TiW/NiW/Cu BLM at 250 degree C. continuously for 40 minutes. FIG. 5A is for lower magnification, and FIG. 5B for higher magnification. TiW is an adhesion layer; NiW is a reaction barrier layer; and Cu is a solderable layer which is totally consumed by reacting with solder.

Figure 7A:
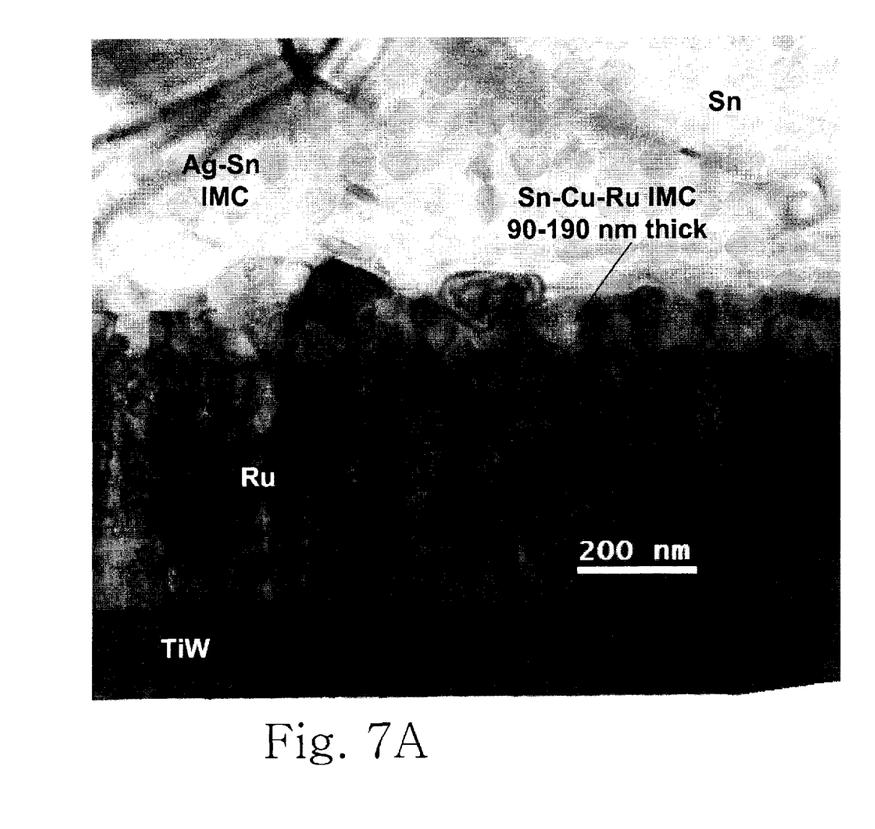
FIG. 7A is a SEM cross-sectional view of binary Sn3.8% Ag Pb-free solder alloy after reaction with a two-layer TiW/Ru BLM at 250 degree C. continuously for 20 minutes; TiW serves as an adhesion layer; Ru serves both as a reaction barrier layer and solder wettable layer.

FIG. 7A is a SEM cross-sectional view of binary Sn3.8% Ag Pb-free solder alloy after reaction with a two-layer TiW/Ru BLM at 250 degree C. continuously for 20 minutes; TiW is an adhesion layer; Ru serves both as a reaction barrier layer and solder wettable layer. A thin layer of intermetallic compound is formed at solder and BLM interface.

EXAMPLE 4

A TWO LAYER BLM

The first layer is preferably TiW, Ti or Cr or its alloys. The second layer is preferably Ru, Cu, Ni, Co, Sn or its alloys serving both as a reaction barrier layer and a wettable surface.

EXAMPLE 5

A THREE LAYER BLM STRUCTURE

A three layer BLM structure comprising preferably a TiW, Ti or Cr as an adhesion layer deposited on a substrate, a Ni or its alloys serving as a reaction barrier layer on the adhesion layer, and a Cu sacrificial layer for plating solder deposition. A lead free solder of Sn, or an SnAg binary alloy is deposited on the Cu layer. When reflowed, as described above, the Cu layer is dissolved into the resulting solder ball to alloy with the solder. The solder is preferably lead-free, and a binary Sn—Cu alloy or a ternary Sn—Ag—Cu alloy is formed when the Cu is dissolved into the solder wherein the original solders were pure Sn and binary Sn—Ag, respectively.

The BLM metallurgy of the present invention may be further improved in robustness by annealing at 150-350 degrees C. for 30 to 90 minutes either before or after BLM patterning.

Thus, while there have been shown and described and pointed out fundamental novel features of the invention as applied to currently preferred embodiments thereof, it will be understood that various omissions, substitutions and changes in the form and details of the method and product illustrated, and in their operation, may be made by those skilled in the art without departing from the spirit of the invention. In addition it is to be understood that the drawings are not necessarily drawn to scale. It is the intention, therefore, to be limited only as indicated by the scope of the claims appended herewith and equivalents thereof.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what We claim as new and desire to secure by Letters Patent is as follows:

1. In an interconnection structure suitable for flip-chip attachment of microelectronic device chips to chip carriers, a three-layer ball limiting metallurgy consisting of:

an adhesion/diffusion layer deposited on a wafer or substrate, said adhesion/diffusion layer having a upper surface and a lower surface and being formed of a material selected from the group consisting of Ta, and alloys of Cr, Ta and W, said lower surface being in continuous direct coplanar contact solely with said wafer or said substrate;

a solder reaction barrier layer having a upper surface and a lower surface and being formed of a material selected from the group consisting of Co, Ru, W, V, Rb, Hf, Mo and their alloys; and an alloy of Ni and one or more elements selected from the group consisting of Co, Mo, W, Ru, Ti, La, Zr, Hf, Cr, Cu, Rb, Ir, Re, Nb, Ta, Au, Pd and Pt, to form a binary, ternary or quaternary alloyed solder reaction barrier layer, and wherein a Ni alloy reaction barrier layer is formed by alloying Ni with W to form a binary nonmagnetic NiW alloy layer, said W composition is greater than 17 weight percent to facilitate sputter-deposition from a nonmagnetic target;

a solder wettable layer formed of a material selected from the group consisting of an alloy of Sn, Pt or Sn;

and optionally consisting of a fourth layer formed of a material selected from the group consisting of Au and Sn;

said upper surface of said adhesion/diffusion layer is in continuous contact with said lower surface of said solder reaction barrier layer.

* * * * *